(12) United States Patent  (10) Patent No.: US 7,478,541 B2
Manole et al.  (45) Date of Patent: Jan. 20, 2009

(54) COMPACT REFRIGERATION SYSTEM FOR PROVIDING MULTIPLE LEVELS OF COOLING

(75) Inventors: Dan M. Manole, Tecumseh, MI (US); Donald L. Coffey, Ann Arbor, MI (US); Michael J. Moore, Adrian, MI (US)

(73) Assignee: Tecumseh Products Company, Ann Arbor, MI (US)

( * ) Notice: Subject to any disclaimer, the term of this patent is extended or adjusted under 35 U.S.C. 154(b) by 457 days.

(21) Appl. No.: 11/263,109

(22) Filed: Oct. 31, 2005

(65) Prior Publication Data

US 2006/0090494 A1   May 4, 2006

Related U.S. Application Data

(63) Continuation-in-part of application No. 10/986,704, filed on Nov. 12, 2004.

(60) Provisional application No. 60/623,953, filed on Nov. 1, 2004.

(51) Int. Cl.
*F25D 23/12* (2006.01)

(52) U.S. Cl. ............... 62/259.2; 62/197; 62/513

(58) Field of Classification Search ............... 62/197, 62/259.2, 513, 525; 165/80.4, 104.33
See application file for complete search history.

(56) References Cited

U.S. PATENT DOCUMENTS

| | | | |
|---|---|---|---|
| 1,149,065 A | 8/1915 | Bain et al. | |
| 2,093,471 A | 9/1937 | Newill et al. | 62/115 |
| 2,279,804 A | 4/1942 | Walz | 62/104 |
| 2,546,417 A | 9/1951 | Anglin | 62/141 |
| 2,591,178 A | 4/1952 | McAdam | 62/4 |
| 2,676,667 A | 4/1954 | Dodge | 183/2 |
| 3,766,750 A | 10/1973 | Aoh et al. | 62/259 |
| 3,904,933 A | 9/1975 | Davis | 317/100 |
| 4,253,515 A | 3/1981 | Swiatosz | 165/61 |
| 4,285,204 A | 8/1981 | Vana | 62/81 |
| 4,322,737 A | 3/1982 | Sliwa, Jr. | 357/82 |
| 4,392,362 A | 7/1983 | Little | 62/514 R |
| 4,489,470 A | 12/1984 | Hull et al. | 29/157.3 C |
| 4,489,570 A | 12/1984 | Little | 62/514 R |
| 4,583,519 A | 4/1986 | Gronert et al. | 126/418 |
| 4,680,673 A | 7/1987 | Taverdet | 361/385 |
| 4,680,939 A | 7/1987 | Rojey et al. | 62/114 |
| 4,709,560 A | 12/1987 | Voorhis et al. | 62/508 |
| 4,756,164 A | 7/1988 | James et al. | 62/119 |
| 4,950,181 A | 8/1990 | Porter | 439/485 |
| 5,181,167 A | 1/1993 | Davidson et al. | 361/385 |
| 5,291,941 A * | 3/1994 | Enomoto et al. | 165/62 |
| 5,315,830 A | 5/1994 | Doke et al. | 62/3.2 |

(Continued)

FOREIGN PATENT DOCUMENTS

EP   0 989 795   3/2000

*Primary Examiner*—Melvin Jones
(74) *Attorney, Agent, or Firm*—Baker & Daniels LLP

(57) ABSTRACT

A refrigeration system for use in cooling electronic equipment includes a closed vapor compression circuit having operably disposed therein a compressor, a condenser, a first expansion device, a second expansion device, and a two-part evaporator. A first part of the evaporator receives working fluid from the first expansion device at a first pressure, and a second part of the evaporator receives working fluid from the second expansion device at a second pressure that is different than the first pressure.

19 Claims, 12 Drawing Sheets

U.S. PATENT DOCUMENTS

| | | |
|---|---|---|
| 5,349,823 A | 9/1994 | Solomon .......................... 62/6 |
| 5,365,749 A | 11/1994 | Porter ....................... 62/259.2 |
| 5,367,879 A | 11/1994 | Doke et al. .................... 62/3.6 |
| 5,471,850 A | 12/1995 | Cowans ........................ 62/223 |
| 5,491,980 A | 2/1996 | Yingst et al. .................. 62/237 |
| 5,501,076 A | 3/1996 | Sharp, III et al. .............. 62/3.6 |
| 5,504,924 A | 4/1996 | Ohashi et al. ................ 375/800 |
| 5,574,627 A | 11/1996 | Porter ....................... 361/719 |
| 5,587,880 A | 12/1996 | Phillips et al. .............. 361/687 |
| 5,611,214 A | 3/1997 | Wegeng et al. ................ 62/498 |
| 5,634,351 A | 6/1997 | Larson et al. .............. 62/259.2 |
| 5,647,430 A | 7/1997 | Tajima .................. 165/104.33 |
| 5,657,641 A | 8/1997 | Cunningham et al. .......... 62/263 |
| 5,862,038 A | 1/1999 | Suzuki et al. ................ 361/704 |
| 5,895,793 A | 4/1999 | Kitamura et al. ............. 252/350 |
| 5,896,922 A | 4/1999 | Chrysler et al. ............. 165/165 |
| 5,930,135 A | 7/1999 | Janko ........................ 363/144 |
| 5,934,364 A | 8/1999 | Chrysler et al. ............. 165/170 |
| 5,954,127 A | 9/1999 | Chrysler et al. ............. 165/170 |
| 5,963,425 A | 10/1999 | Chrysler et al. ............. 361/695 |
| 5,970,731 A | 10/1999 | Hare et al. .................. 62/196.4 |
| 5,992,168 A | 11/1999 | Pfister et al. ................ 62/259.2 |
| 5,999,404 A | 12/1999 | Hileman ..................... 361/699 |
| 6,029,742 A | 2/2000 | Burward-Hoy ............ 165/80.4 |
| 6,031,751 A | 2/2000 | Janko ........................ 363/144 |
| 6,034,872 A | 3/2000 | Chrysler et al. ............. 361/699 |
| 6,035,655 A | 3/2000 | Hare et al. .................. 62/259.2 |
| 6,053,238 A | 4/2000 | Goth et al. .................... 165/10 |
| 6,054,676 A | 4/2000 | Wall et al. ................... 219/209 |
| 6,058,010 A | 5/2000 | Schmidt et al. ............. 361/689 |
| 6,082,445 A | 7/2000 | Dugan ........................ 165/167 |
| 6,138,469 A | 10/2000 | Davidson et al. ........... 62/259.2 |
| 6,148,635 A | 11/2000 | Beebe et al. .................. 62/498 |
| 6,167,621 B1 | 1/2001 | Goth et al. ............. 29/890.054 |
| 6,189,601 B1 | 2/2001 | Goodman et al. .......... 165/80.3 |
| 6,205,803 B1 | 3/2001 | Scaringe ................... 62/259.2 |
| 6,213,194 B1 | 4/2001 | Chrysler et al. ............ 165/80.3 |
| 6,233,955 B1 | 5/2001 | Egara ....................... 62/196.4 |
| 6,246,581 B1 | 6/2001 | Kang et al. ................. 361/700 |
| 6,285,550 B1 | 9/2001 | Belady ....................... 361/704 |
| 6,286,589 B1 | 9/2001 | Uehara ....................... 165/166 |
| 6,295,826 B1 | 10/2001 | Lee .............................. 62/244 |
| 6,301,109 B1 | 10/2001 | Chu et al. .................... 361/690 |
| 6,328,907 B1 | 12/2001 | Nakada et al. ................ 252/67 |
| 6,345,512 B1 | 2/2002 | Cosley et al. .............. 62/259.2 |
| 6,362,153 B1 | 3/2002 | Wilson et al. ............... 510/412 |
| 6,378,320 B1 | 4/2002 | Matambo et al. ........... 62/259.2 |
| 6,389,695 B1 | 5/2002 | Dall'Oro et al. ......... 29/890.03 |
| 6,397,618 B1 | 6/2002 | Chu et al. .................. 62/259.2 |
| 6,404,640 B1 | 6/2002 | Ishimine et al. ............. 361/720 |
| 6,415,619 B1 | 7/2002 | Bash et al. ................. 62/228.4 |
| 6,422,018 B1 | 7/2002 | Tisdale et al. ................. 60/728 |
| 6,422,310 B2 | 7/2002 | Egara ......................... 165/281 |
| 6,427,483 B1 | 8/2002 | Rashad et al. ................. 62/613 |
| 6,438,984 B1 | 8/2002 | Novotny et al. ............ 62/259.2 |
| 6,462,949 B1 | 10/2002 | Parish, IV et al. ........... 361/699 |
| 6,490,877 B2 | 12/2002 | Bash et al. .................... 62/200 |
| 6,493,223 B1 | 12/2002 | Viswanath et al. ........... 361/690 |
| 6,519,500 B1 | 2/2003 | White ........................ 700/119 |
| 6,530,425 B2 | 3/2003 | Wehrmann et al. .......... 165/167 |
| 6,536,510 B2 | 3/2003 | Khrustalev et al. ..... 165/104.33 |
| 6,542,365 B2 | 4/2003 | Inoue ......................... 361/699 |
| 6,567,269 B2 | 5/2003 | Homer et al. ................ 361/700 |
| 6,587,343 B2 | 7/2003 | Novotny et al. ............. 361/698 |
| 6,590,770 B1 | 7/2003 | Rogers et al. ................ 361/697 |
| 6,592,696 B1 | 7/2003 | Burdon et al. ........... 156/89.12 |
| 6,614,353 B2 | 9/2003 | Ozawa ....................... 340/585 |
| 6,631,625 B1 | 10/2003 | Weng ........................... 62/509 |
| 6,637,226 B2 | 10/2003 | Watanabe et al. .............. 62/201 |
| 6,662,865 B2 | 12/2003 | Beitelmal et al. ............ 165/206 |
| 6,672,381 B2 | 1/2004 | Beitelmal et al. ............ 165/206 |
| 6,687,122 B2 | 2/2004 | Monfarad ................... 361/687 |
| 2002/0050148 A1 | 5/2002 | Shyy et al. .................... 62/498 |
| 2002/0105779 A1 | 8/2002 | Lei et al. .................... 361/687 |
| 2002/0121094 A1 | 9/2002 | VanHoudt ..................... 62/3.3 |
| 2002/0148237 A1 | 10/2002 | Thiesen et al. ................... 62/6 |
| 2002/0185267 A1 | 12/2002 | Ohgaki ....................... 165/171 |
| 2003/0034151 A1 | 2/2003 | Lopatinsky et al. ......... 165/122 |
| 2003/0043542 A1 | 3/2003 | Monfarad ................... 361/687 |
| 2003/0070792 A1 | 4/2003 | Tanaka et al. .......... 165/104.21 |
| 2003/0141037 A1 | 7/2003 | Zobel et al. .................... 165/41 |

\* cited by examiner

COMPACT REFRIGERATION SYSTEM FOR PROVIDING MULTIPLE LEVELS OF COOLING

CROSS REFERENCE TO RELATED APPLICATIONS

This application is a Continuation-in-part of U.S. patent application Ser. No. 10/986,704, entitled COMPACT REFRIGERATION SYSTEM AND POWER SUPPLY INCLUDING DYNAMIC INSULATION, filed on Nov. 12, 2004, which is hereby incorporated herein by reference. This application is related to and claims the benefit under Title 35, U.S.C. § 119(e) of U.S. Provisional Patent Application Ser. No. 60/623,953, entitled COMPACT REFRIGERATION SYSTEMS AND HEAT EXCHANGERS, filed on Nov. 1, 2004, which is also hereby incorporated herein by reference.

BACKGROUND OF THE INVENTION

1. Field of the Invention

The present invention relates to compact, modular cooling systems.

2. Description of the Related Art

As electronic equipment has become increasingly smaller, the heat dissipation requirements of such equipment is exceeding the capacity of cooling systems employing only forced air to convectively cool the equipment. Moreover, a computer typically has various components with different cooling requirements. For example, the main processor will require relatively intense cooling, while many of the other electronic components will require relatively moderate cooling.

An improved compact cooling system that can be employed to cool such electronic equipment is needed in the art. A compact cooling system that can cool the electronic equipment in an efficient manner is particularly needed in the art.

SUMMARY OF THE INVENTION

The present invention provides a modular compact cooling system that can be employed in the cooling of electronic equipment. The modular compact cooling system includes a two-part evaporator that can simultaneously provide different levels of cooling to electronic components having different cooling requirements. More particularly, the first, outer portion of the evaporator receives low pressure refrigerant at a first pressure, while the second inner portion of the evaporator receives refrigerant at a second pressure. The second pressure is lower than the first pressure and, therefore, the inner evaporator compartment is colder than the outer evaporator portion. The outer portion of the evaporator has external heat flux surfaces which provide low intensity cooling either by direct contact or by attaching a finned heat exchanger to the heat flux surface. The inner evaporator provides a more intense cooling and can be used to cool a microprocessor. Access to the inner evaporator is provided by blind bore openings in thermal communication with the inner evaporator. Heat pipes or other means of transferring thermal energy between two locations are inserted into the bore holes and used to provide thermal communication between the inner, colder evaporator portion and the structure to be cooled. In an alternative embodiment, the colder high intensity portion is located side-by-side with the warmer low intensity portion. The low intensity portion is provided with fins to cool air which is then blown on the equipment to be cooled. The high intensity portion is provided with access openings for heat pipes or similar thermal communication means.

The evaporator may include flat surfaces where either heat spreaders, such as a finned heat exchanger, can be attached to cool air for the computer enclosure. Alternatively, heat pipes, thermosyphones, thermoelectric devices, or single phase systems can be thermally coupled to the flat surfaces of the evaporator to transfer the cooling load from the evaporator to the locations in the computer where cooling is required. For example, the evaporator may have cavities where heat pipes, thermosyphones or other thermally conductive devices can be inserted to thermally couple the evaporator with the locations that require cooling.

For example, in some applications, a Stirling engine might be employed to transfer thermal energy from the heat source (i.e., the electronic equipment being cooled) to a heat sink (i.e., the evaporator) where the temperature difference between the heat source and heat sink are sufficiently great to operate the Stirling engine.

The primary function of the devices that attach to the evaporator is to transfer thermal energy from the location to be cooled to the evaporator and such devices are not used to provide any significant temperature lift. The CRS is used to deliver the heat absorbed by the evaporator to the ambient environment through a condenser at a higher temperature level than that of the object being cooled. By utilizing a condenser with a relatively high temperature level, more heat transfer per a given heat transfer surface area can be obtained, thereby facilitating the use of a relatively smaller heat transfer surface for the condenser and improving the volumetric efficiency of the overall CRS. There are limits, however, on the operating temperatures of the CRS. For example, the maximum temperature of the condenser cannot be so great as to raise the ambient temperature to levels causing discomfort to the occupants of the space. There are also limits on the lower temperatures generated by the CRS. In order to avoid the condensation of water on the cooled equipment, the CRS should not be operated in a manner in which the temperature of the cooled electronic equipment is reduced to a temperature below the dew point of the ambient air.

When cooling a computer that has different cooling requirements at different locations, e.g., low intensity cooling locations and high intensity cooling locations, cooling all of the locations by thermally coupling each location to a heat sink at a common temperature may inadequately cool the high intensity locations if the heat sink temperature is selected for the low intensity locations. On the other hand, selecting the heat sink temperature for the high intensity locations may result in overcooling of the low intensity locations. The cooling of the locations may also depend in part on the relative efficiencies of the thermal transfer mechanism between the locations and the evaporator. However, the ability to couple the high intensity locations to a heat sink that is at a lower temperature than the heat sink that is coupled to the low intensity locations would still be advantageous.

The invention comprises, in one form thereof, a refrigeration system for use in cooling electronic equipment. The refrigeration system includes a closed vapor compression circuit having operably disposed therein a compressor, a condenser, a first expansion device, a second expansion device, and a two-part evaporator. A first part of the evaporator receives working fluid from the first expansion device at a first pressure, and a second part of the evaporator receives working fluid from the second expansion device at a second pressure that is different than the first pressure.

The invention comprises, in another form thereof, a compact refrigeration system including a closed vapor compression circuit having operably disposed therein a compressor, a condenser, at least one expansion device and a two-part evaporator. A first part of the evaporator at least partially envelops a second part of the evaporator. The circuit is configured such that a working fluid temperature in the first part of the evaporator is higher than a working fluid temperature in the second part of the evaporator during operation.

The invention comprises, in yet another form thereof, a method of operating a refrigeration system, including providing a closed vapor compression circuit having operably disposed therein a compressor, a condenser, a first expansion device, a second expansion device, and a two-part evaporator. Working fluid is received in a first part of the evaporator from the first expansion device at a first pressure. Working fluid is received in a second part of the evaporator from the second expansion device at a second pressure that is different from the first pressure.

An advantage of the present invention is that the refrigeration system can simultaneously provide different levels of cooling capacity to components having different levels of cooling needs. Thus, the system enables efficient operation of a combined computer and refrigeration system by providing a different, efficient level of cooling for different computer components.

Another advantage is that a cold, high intensity evaporator section may be disposed within, and thus thermally insulated by, a slightly less cold, lower intensity evaporator section.

Yet another advantage is that the refrigerant from the higher intensity evaporator section and the refrigerant from the lower intensity evaporator section may enter the compressor at substantially equal pressures.

A further advantage is that the user is not required to add any external tubing to the system to direct the refrigerant, or other chilled liquid, to places where the cooling is needed.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Figure 1:
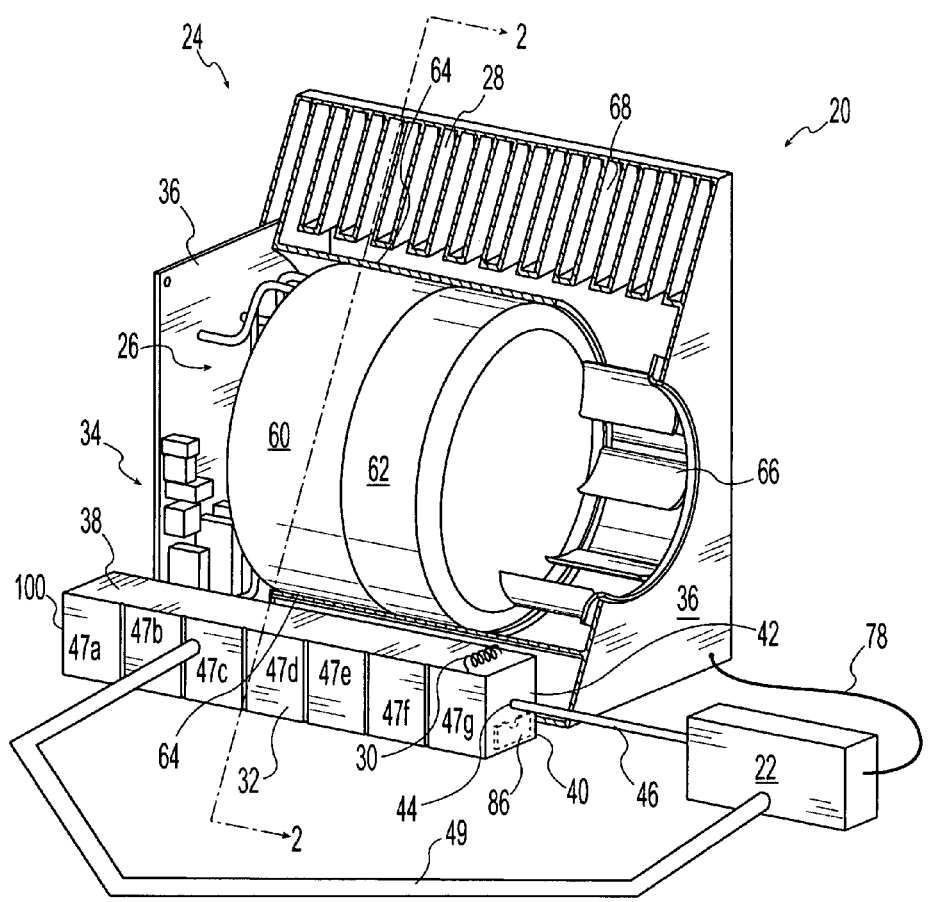
FIG. 1 is a perspective, partially sectional view of one embodiment of a refrigeration system of the present invention configured to cool and power a computer.

Corresponding reference characters indicate corresponding parts throughout the several views. Although the exemplification set out herein illustrate embodiments of the invention, in several forms, the embodiments disclosed below are not intended to be exhaustive or to be construed as limiting the scope of the invention to the precise forms disclosed.

DESCRIPTION OF THE PRESENT INVENTION

In accordance with the present invention, FIG. 1 illustrates one embodiment of a self contained complete refrigeration system (CRS) 20 for a computer 22 or other electronics. CRS 20 includes a closed vapor compression circuit 24 having operably disposed therein, in serial order, a compressor 26, a first heat exchanger in the form of a condenser 28, an expansion device in the form of a coiled capillary tube 30, and a second heat exchanger in the form of an evaporator 32. Compression circuit 24 and electronics 34 of CRS 20 are disposed inside a housing 36 of CRS 20. Evaporator 32 has two flat surfaces 38, 40 that are perpendicular to each other and that face an interior of housing 36. A third flat surface 42 is disposed adjacent an outer wall of housing 36 such that surface 42 faces computer 22.

The illustrated CRS 20 does not require the user to add any external tubing to the CRS 20 to direct the refrigerant, or other chilled liquid, to places where the cooling is needed. Heat spreaders such as heat pipes, thermosyphones, thermoelectric devices, or single phase systems can be thermally coupled to the evaporator 32 to transfer the cooling load from evaporator 32 to the locations in the computer where cooling is required. More particularly, surface 42 includes a thermal exchange feature in the form of a socket or cavity 44 in which a heat pipe 46, thermosyphone or other thermally conductive device can be inserted to thermally couple the evaporator 32 with the locations that require cooling, such as computer 22. Moreover, evaporator 32 includes other thermal exchange features in the form of cold plates 47a-g, each of which may have a different temperature and/or heat load. Another heat pipe 49 may be thermally connected to computer 22 and to one or more of cold plates 47a-g. In the embodiment shown, heat pipe 49 is thermally coupled to cold plate 47c. Thus, heat pipe 49 may carry heat from computer 22 to cold plate 47c. Both heat pipe 46 and heat pipe 49 thermally interconnect evaporator 32 with computer 22. Alternatively, other types of heat spreaders, such as a finned heat exchanger, can be attached to a surface of evaporator 32 in order to provide cool air for the computer enclosure. The term "thermal exchange feature" as used herein refers to mating faces on evaporator 32 through which heat may be passed to evaporator 32. Examples of such thermal exchange features include cavity 44 and cold plates 47.

In some applications, a Stirling engine might be employed to transfer thermal energy from the heat source (i.e., the electronic equipment being cooled) to a heat sink (i.e., the evaporator) where the temperature difference between the heat source and heat sink are sufficiently great to operate the Stirling engine.

Figure 2:
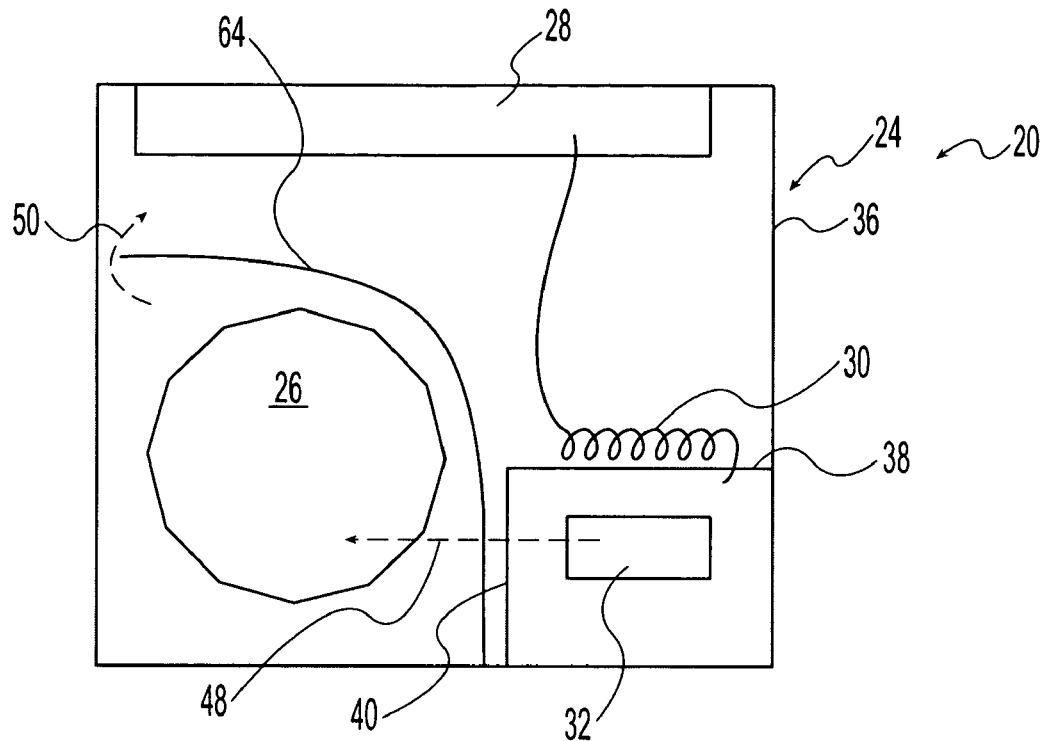
FIG. 2 is a schematic, side view of the refrigeration system of FIG. 1 along line 2-2.
Figure 3:
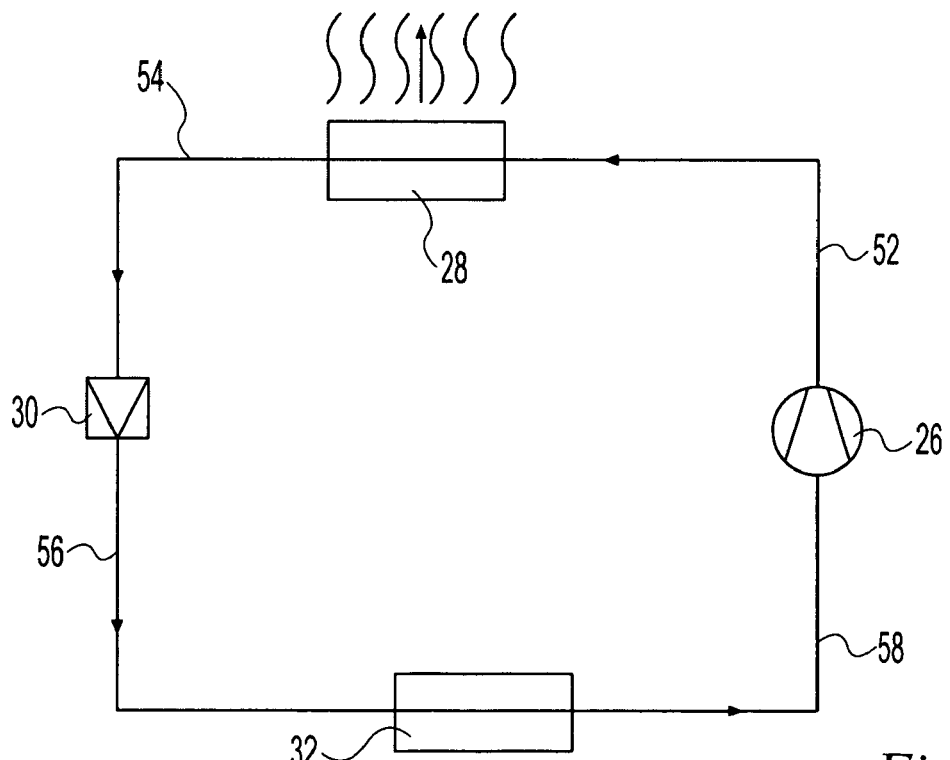
FIG. 3 is a fluid schematic diagram of the refrigeration system of FIG. 1.

FIGS. 2 and 3 schematically illustrate the CRS 20 of FIG. 1. In operation, the compressor 26 receives suction pressure refrigerant from the evaporator 32, as indicated by dashed arrow 48, and discharges compressed refrigerant to the condenser 28, as indicated by dashed arrow 50. Condenser 28 removes thermal energy from the working fluid, while evaporator 32 adds thermal energy to the working fluid. After the high pressure refrigerant is cooled in the condenser 28, high pressure liquid refrigerant enters the evaporator 32 from the condenser 28 through an expansion device such as capillary tube 30. The reduced pressure refrigerant then absorbs thermal energy as it is converted from a liquid phase to a gas phase. Fluid conduits 52, 54, 56 and 58 interconnect compressor 26, condenser 28, expansion device 30 and evaporator 32.

As can be seen in FIG. 1, compressor 26 can be in the form of a horizontally oriented rotary compressor having a compression mechanism 60 and a motor 62. Compressor 26 may be located within a cylindrical, hermetically sealed compartment 64 that is centrally mounted within the CRS 20 in the interior of the housing 36. The interior volume of the compressor compartment 64 may be at either the discharge or suction pressure. Although a rotary compressor mechanism 60 is employed with the CRS 20 illustrated in FIG. 1, other types of compressor mechanisms may also be used.

Condenser 28 may include a fan 66 for blowing or drawing air across and thereby cooling the condenser's fluid-carrying fins 68. Fan 66 may be disposed within housing 36, as shown in FIG. 1, or disposed outside housing 36. If fan 66 is disposed outside housing 36, housing 36 may be provided with slits or other openings for allowing air blown or drawn by fan 66 to impinge upon and between fins 68. The high pressure refrigerant condenses on the interior surfaces of the condenser structure. By providing a significant quantity of vertically oriented interior surfaces within the condenser 28 on the ends walls and condenser fins 68, the condenser facilitates the condensation of the refrigerant by falling film condensation.

The liquid phase refrigerant within the condenser 28 collects at the bottom of the condenser 28 where it enters an expansion device, such as capillary tube 30, and then the evaporator 32 as schematically illustrated in FIG. 2. The refrigerant exiting the evaporator 32 is directed to the intake port of the compressor mechanism 60 and the cycle is then repeated.

Figure 4:
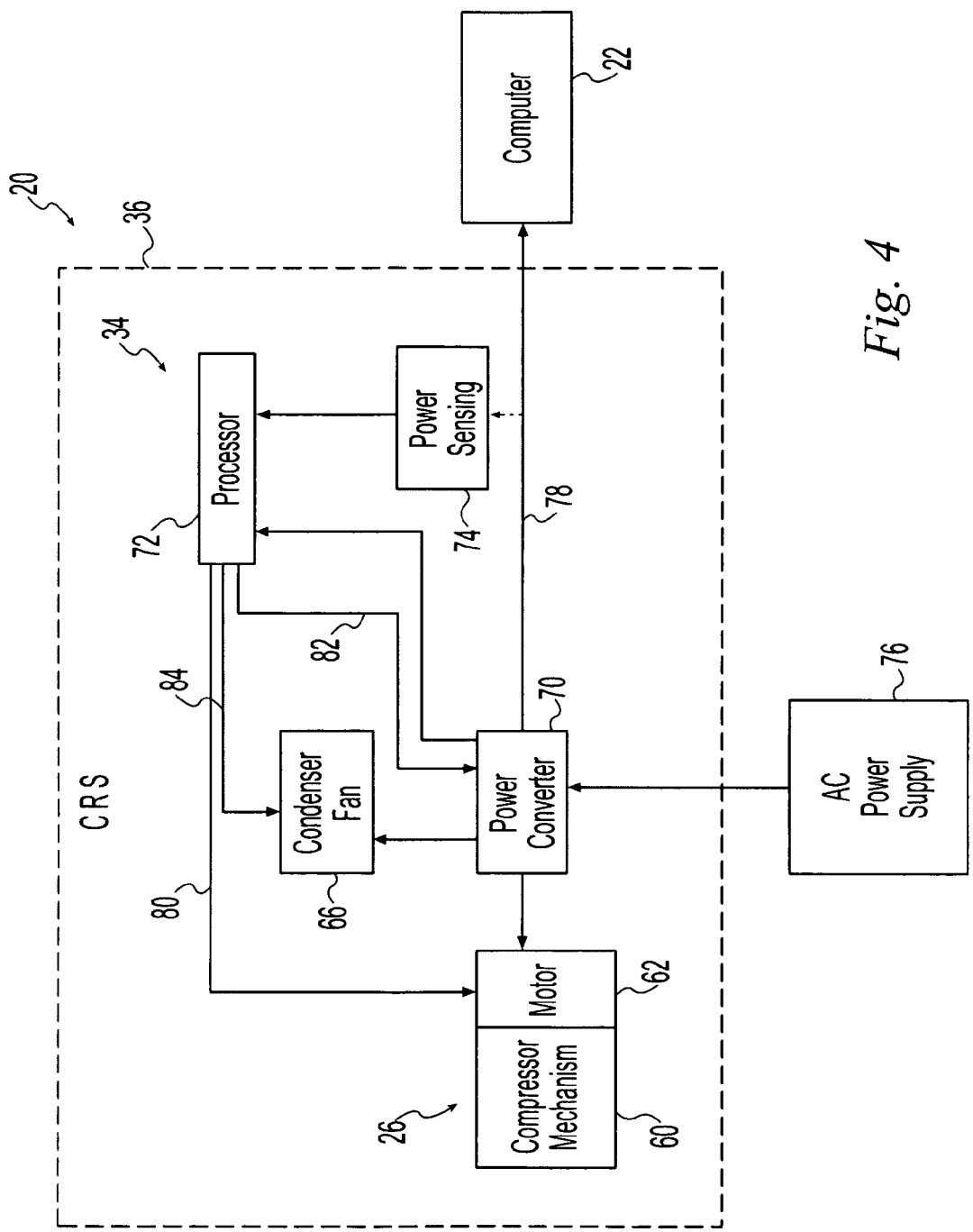
FIG. 4 is an electrical schematic diagram of the refrigeration system and computer of FIG. 1.

Electronics 34 includes a DC power supply in the form of an AC-to-DC converter 70 (FIG. 4), a processor 72 and a power sensing device 74. Converter 70 is operably coupled to an external AC power supply 76 and to refrigeration system components including compressor motor 62 and condenser fan 66. Compressor motor 62 and condenser fan 66 are operably coupled, in turn, to compression circuit 24, such as to compression mechanism 60 and condenser 28, respectively. AC power supply 76 can be a standard wall outlet that provides household current.

Converter 70 converts the AC power from AC power supply 76 into DC power. Converter 70 then supplies the DC power to both computer 22 and the components of refrigeration system 20. The components of refrigeration system 20 that receive DC power from converter 70 may include compressor motor 62, condenser fan 66, processor 72 and power sensing device 74. A different level of DC voltage, current and power may be provided to each of the components of refrigeration system 20 and to computer 22 by converter 70.

Power sensing device 74 may measure the DC power supplied to the electronic equipment, such as computer 22, that is cooled and powered by CRS 20. That is, power sensing device 74 may measure the DC power supplied to computer 22 via power line 78. For example, power sensing device 74 may include a known resistance (not shown) disposed in power line 78. Power sensing device 74 may measure and monitor the voltage drop across the known resistance to thereby determine the power level, as is well known in the art.

Processor 72 is in communication with power sensing device 74 and may receive from device 74 information related to the power consumption of computer 22. Processor 72 may receive only voltage measurements or similar data from device 74, and processor 72 may calculate the power consumption of computer 22 based upon this data. Based upon the power consumption of computer 22, and perhaps other variables, processor 72 may determine and/or predict the cooling needs of computer 22 and modify the operation of CRS 20 accordingly.

Processor 72 may be operably coupled to compressor 26, which may have a variable operating speed. More particularly, processor 72 may control the level of DC voltage that is applied to motor 62, which drives compressor mechanism 60. By varying the DC voltage applied to motor 62, the operating speed of compressor mechanism 60 may be controlled. Thus, processor 72 may control the operating speed of compressor 26 as a function of variables including measurements obtained from power sensing device 74. Processor 72 may send control signals to motor 62 directly, such as via a line 80. Alternatively, processor 72 may send control signals to power converter 70 via line 82 in order to control the DC voltage applied to motor 62 by converter 70.

Similarly, processor 72 may be operably coupled to condenser fan 66, which may have a variable operating speed. More particularly, processor 72 may control the level of DC voltage that is applied to fan 66. By varying the DC voltage applied to fan 66, the operating speed of fan 66 may be controlled. Thus, processor 72 may control the operating speed of fan 66 as a function of variables including measurements obtained from power sensing device 74. Processor 72 may send control signals to fan 66 directly, such as via a line 84. Alternatively, processor 72 may send control signals to power converter 70 via line 82 in order to control the DC voltage applied to fan 66 by converter 70.

Processor 72 may store the measurements from power sensing device 74 and identify cyclical patterns in the measured amount of power used by computer 22. The power consumption of computer 22 may have a cyclical pattern that repeats on a daily basis. For example, the power consumption of computer 22 may be very low from 5 p.m. to 8 a.m., i.e., outside of office hours, during a lunch hour of 12 noon to 1 p.m., and/or during a coffee break from 3:00 p.m. to 3:15 p.m. On the other hand, the power consumption of computer 22 may be higher during working hours from 8 a.m. to 12 noon, from 1 p.m. to 3 p.m., and from 3:15 p.m. to 5 p.m.

Processor 72 may vary the operation of CRS 20 based upon the identified cyclical pattern. More particularly, processor 72 may anticipate that the cyclical pattern of power consumption will repeat, and processor 72 may vary the operation of CRS 20 based upon the anticipated repetition of the pattern of power consumption. For example, at 7:55 a.m., when computer 22 is at a standby state, processor 72 may increase the DC voltage applied to motor 62 and/or fan 66 based upon an anticipation that an identified cyclical pattern will be repeated, and that computer 22 will begin to be operated at 8 a.m. Thus, CRS 20 may be provided with additional cooling capacity in order to more quickly meet the anticipated additional cooling needs of computer 22 at 8:00 a.m. CRS 20 may also provide additional cooling to computer 22 in order to lower the temperature of computer 22 before, and in anticipation of, the increased power consumption at 8:00 a.m.

Similarly, processor 72 may decrease the cooling capacity of CRS 20 in anticipation of computer 22 using less power according to the repetition of a cyclical pattern. For example, at 11:55 a.m., when computer 22 is operating in a highly active state, processor 72 may decrease the DC voltage applied to motor 62 and/or fan 66 based upon an anticipation that an identified cyclical pattern will be repeated, and that computer 22 will begin to draw less power at 12 noon. Thus, the cooling capacity of CRS 20 can be decreased so that CRS 20 consumes less power yet is still able to adequately meet the anticipated reduced cooling needs of computer 22 after 12 noon. CRS 20 may also provide a reduced level of cooling to computer 22 before noon, thereby allowing the temperature of computer 22 to rise before and in anticipation of the decreased power consumption at 12 noon.

It is also possible for CRS 20 to store cooling effect in an optional cooling effect storage device 86 that is schematically indicated in dashed lines in FIG. 1. In one embodiment, cooling effect storage device 86 can be selectively placed in contact with heat pipe 46 in order to cool device 86 to a desired level. Device 86 can then be removed from contact with heat pipe 46 to thereby store cooling effect in device 86 for later use. For example, processor 72 may anticipate that computer 22 will consume less power during the user's coffee break from 3:00 p.m. to 3:15 p.m. Because the user may prefer that CRS 20 produce less noise during the coffee break, processor 72 may lower the voltage to motor 62 and/or fan 66 to less than a stand-by level. To compensate for the resulting drop in cooling capacity of CRS 20, processor 72 may cause cooling effect storage device 86 to once again come into contact with heat pipe 46, and thereby provide cooling effect to computer 22 from storage device 86 via heat pipe 46. Thus, beginning at approximately 3 p.m., i.e., slightly before or slightly after 3 p.m., the cooling effect stored in device 86 can be selectively used to quietly cool computer 22 during and/or in anticipation of the user's coffee break.

Cooling effect storage device 86 may also be selectively used to cool the electronic equipment based the measured amount of power consumption without identifying any cyclical patterns in the power consumption. For example, cooling effect can be stored in storage device 86 and may be used by moving device 86 into contact with heat pipe 46 in response to an increase in the measured power drawn by computer 22.

Figure 5:
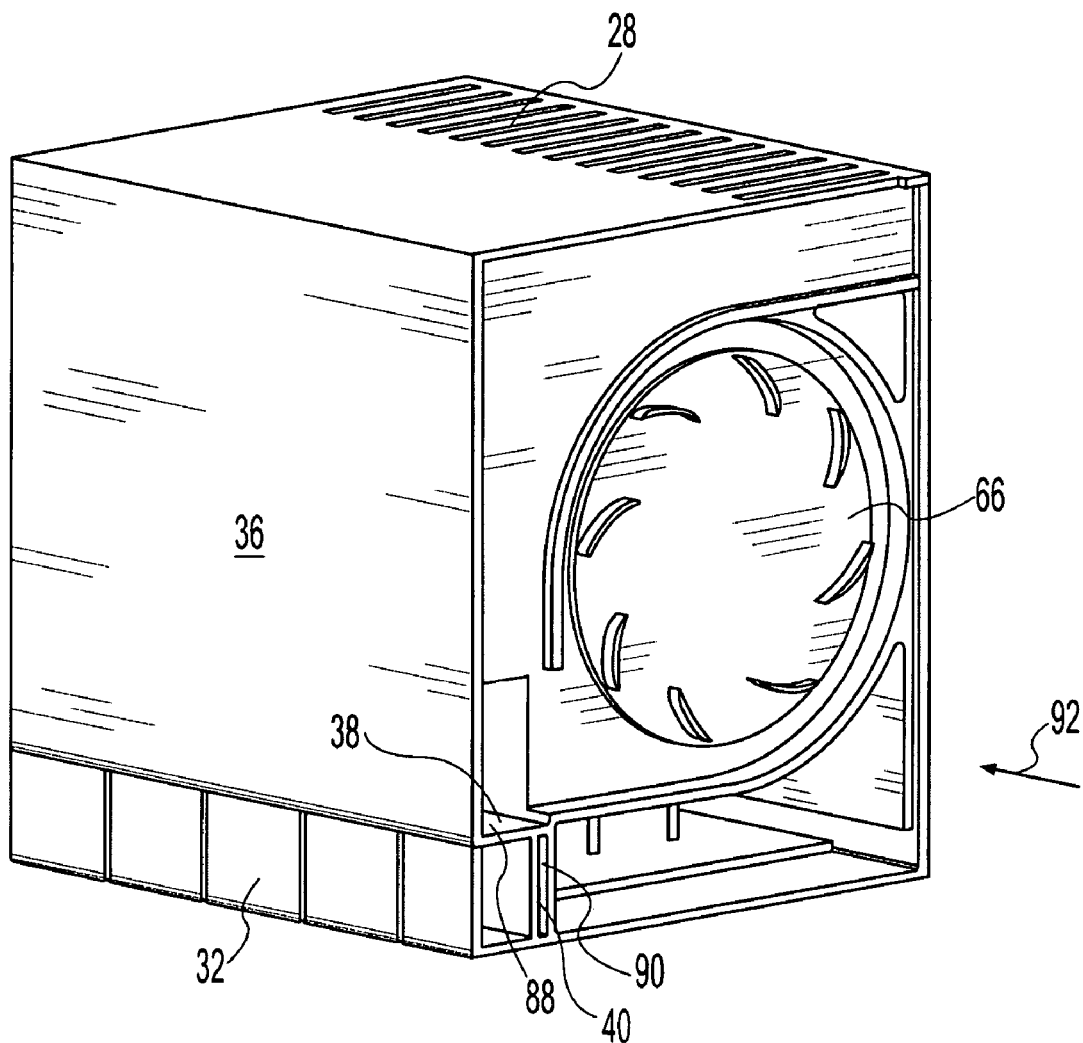
FIG. 5 is another perspective, partially sectional view of the refrigeration system of FIG. 1.

CRS 20 provides a compact design in which the relatively warm condenser 28 is disposed close enough to the relatively cool evaporator 32 that evaporator 32 may absorb heat from condenser 28. Such heat absorption by evaporator 32 may reduce the efficiency of evaporator 32, and thus is to be avoided. In order to reduce the amount of heat from condenser 28 that is absorbed by evaporator 32, CRS 20 may makes use of dynamic insulation. Specifically, housing 36 may define airflow passageways 88, 90 (FIG. 5) that separate condenser 28 from evaporator 32. Airflow passageway 88 may extend along the length of surface 38 of evaporator 32, and airflow passageway 90 may extend along the length of surface 40 of evaporator 32.

An air moving device, such as condenser fan 66, can generate airflows through airflow passageways 88, 90 in a general direction indicated by arrow 92. More particularly, housing 36 may be provided with airflow conduits 94, 96 (FIG. 6) that direct airflows from fan 66 toward condenser 28 and passageways 88, 90, respectively. Air flow passageways 88, 90 may each be defined by at least one high density heat exchange surface for facilitating the adjustment of the orientation of the airflows. Fan 66 may draw air from outside housing 36 into housing 36 and into airflow conduits 94, 96. Alternatively, instead of fan 66, a separate dedicated fan may be provided to blow or draw air from outside housing 36 and into passageways 88, 90.

The airflows through passageways 88, 90 define layers of moving air that may provide thermally insulating layers between condenser 28 and evaporator 32, and thus improve the efficiency of CRS 20. The layers of moving air may enter housing 36 and exit housing 36 at a substantially common temperature. That is, any heat absorbed from condenser 28 by the layers of moving air can be approximately offset by the heat absorbed from the layers of moving air by evaporator 32.

Figure 6:
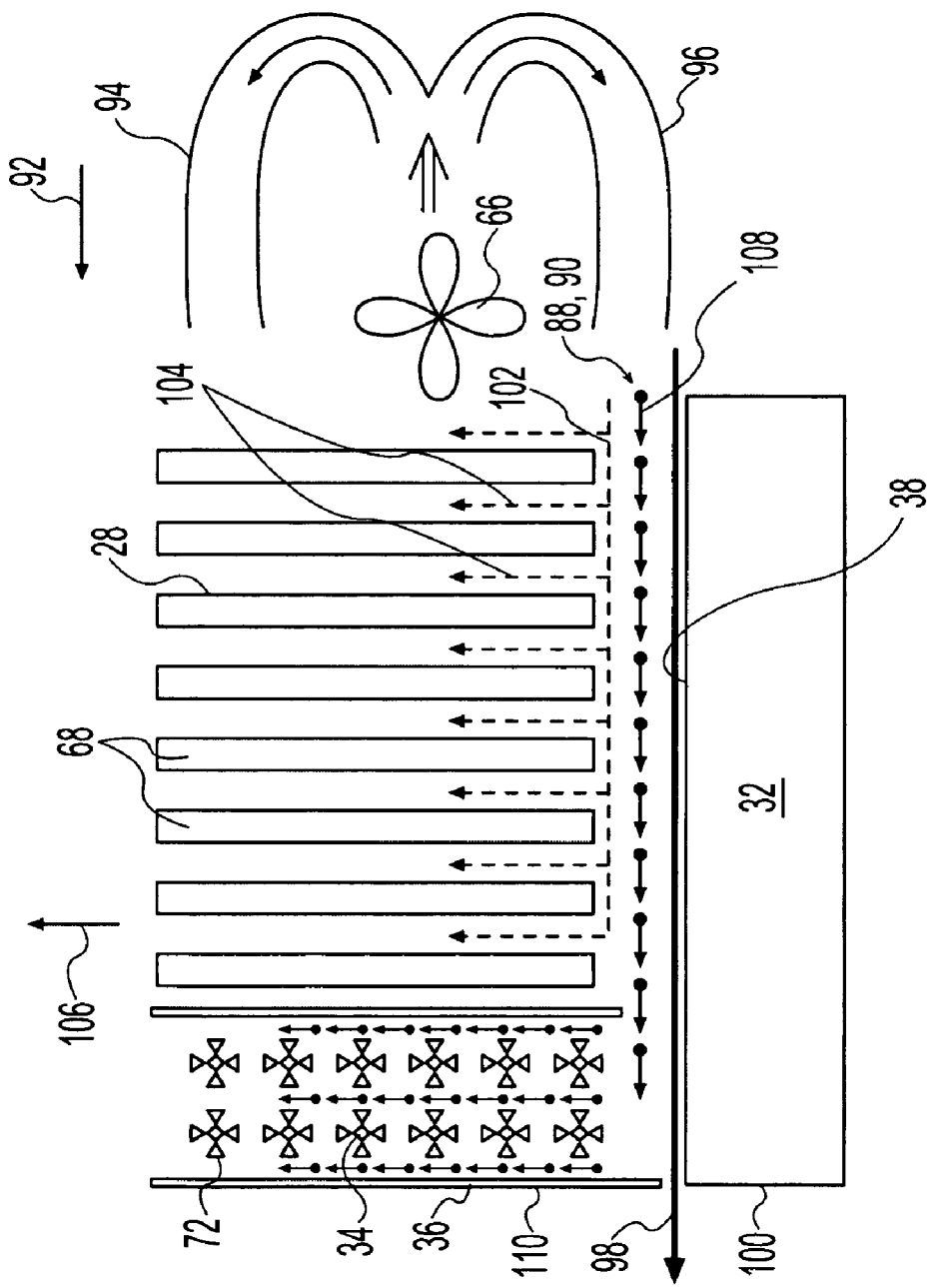
FIG. 6 is an airflow diagram of the refrigeration system of FIG. 1.

As indicated in FIG. 6, the airflows through passageways 88, 90 may be divided into multiple portions that may be directed to different places within and/or outside housing 36. A first portion 98 may flow adjacent to surface 38 and/or surface 40 along the length of evaporator 32. Portion 98 is shown as exiting housing 36 at a location near an end 100 of evaporator 32.

A second portion 102 of the airflow may flow along a side of passageways 88, 90 opposite from first portion 98. That is, second portion 102 may be the portion of the airflow that is closest to condenser 28. After flowing along passageways 88, 90 for some distance, all or substantially all of second portion 102 may be directed onto condenser 28. More particularly, as shown in FIG. 6, as second portion 102 flows in direction 92, a respective one of a plurality of fractions 104 of second portion 102 is redirected between each pair of adjacent fins 68 that are passed by second portion 102. Thus, fractions 104 of second portion 102 are directed in a direction 106 that may be opposite to a direction of heat conduction from condenser 28 to evaporator 32.

The direction of fractions 104, and the separation of fractions 104 from second portion 102, may be caused by airfoils (not shown) or some other type of air guiding element within housing 36. It is also possible for the redirection and separation of fractions 104 to be caused by the fins 68 themselves.

A third portion 108 of the airflow may flow between portions 98 and 102 within passageways 88, 90. After flowing along passageways 88, 90 for some distance, all or substantially all of third portion 108 may be directed onto electronics 34 including power supply 72. In the embodiment shown in FIG. 6, electronics 34 and power supply 72 are disposed at an end of housing 36 that is adjacent to end 100 of evaporator 32.

Third portion 108 may be substantially surrounded and thermally insulated by portions 98, 102. Thus, third portion 108 may remain at a substantially constant temperature while flowing along passageways 88, 90 and until being directed onto electronics 34. It is also possible for the temperature of third portion 108 when it reaches electronics 34 to be substantially equal to the temperature of the air within airflow conduit 96.

The directing or guiding of third portion 108 onto electronics 34 may be caused by airfoils (not shown) or some other type of air guiding element within housing 36. It is also possible, as indicated in FIG. 6, for the directing or guiding of third portion 108 onto electronics 34 to be caused by an end wall 110 of housing 36 that is adjacent to electronics 34.

Another special circumstance encountered in the cooling of a computer is the existence of multiple locations requiring cooling. Each of these cooling locations may operate at a different temperature and have different heat flux densities. For example, it may be desirable for a single refrigeration system to provide both intense low temperature cooling for a microprocessor and a less intense cooling to maintain other electronics in the computer at ambient temperatures.

FIGS. 7-12 illustrate one embodiment of a self contained complete refrigeration system (CRS) 220 for a computer that is partially indicated at 222. CRS 220 has a two-part evaporator 232 with a low-intensity part 231 (FIG. 8) and a high-intensity part 233. A heat spreader, such as heat pipe 245, thermally couples high-intensity part 233 to components of computer 222 that have relatively high cooling needs, or that produce relatively high amounts of heat, such as a microprocessor 221. Heat pipe 245 may be coupled to high-intensity part 233 via a cavity 244 in flat surface 242. Another heat spreader, such as heat pipe 247, thermally couples low-intensity part 231 to at least one component 223 of computer 222 that has relatively low cooling needs, or that produces relatively low amounts of heat. Heat pipe 247 may be coupled to low-intensity part 231 via a cavity 243 in flat surface 241.

Figure 7:
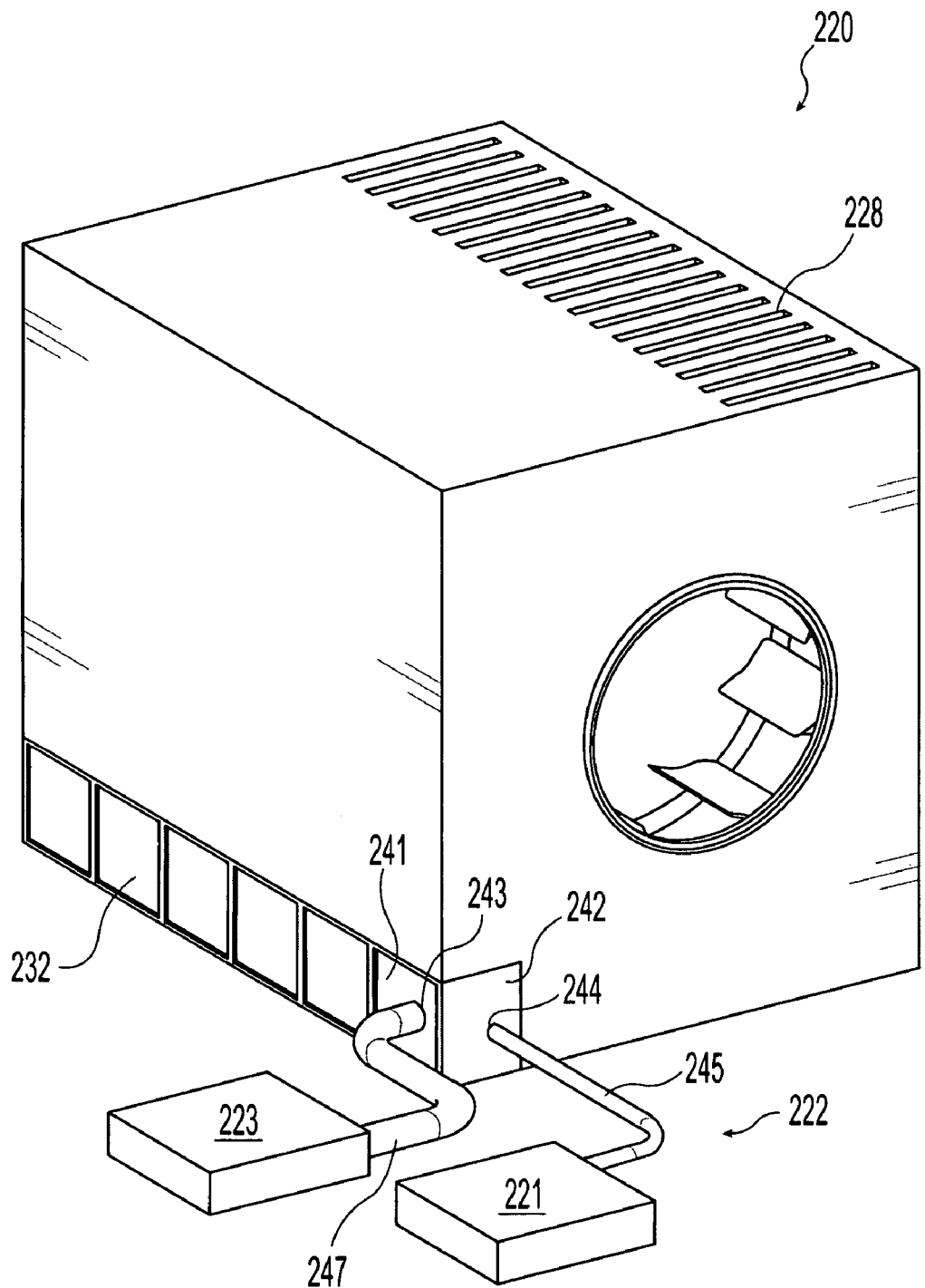
FIG. 7 is a perspective view of the refrigeration system of another embodiment of a refrigeration system of the present invention configured to cool and power a computer.
Figure 8:
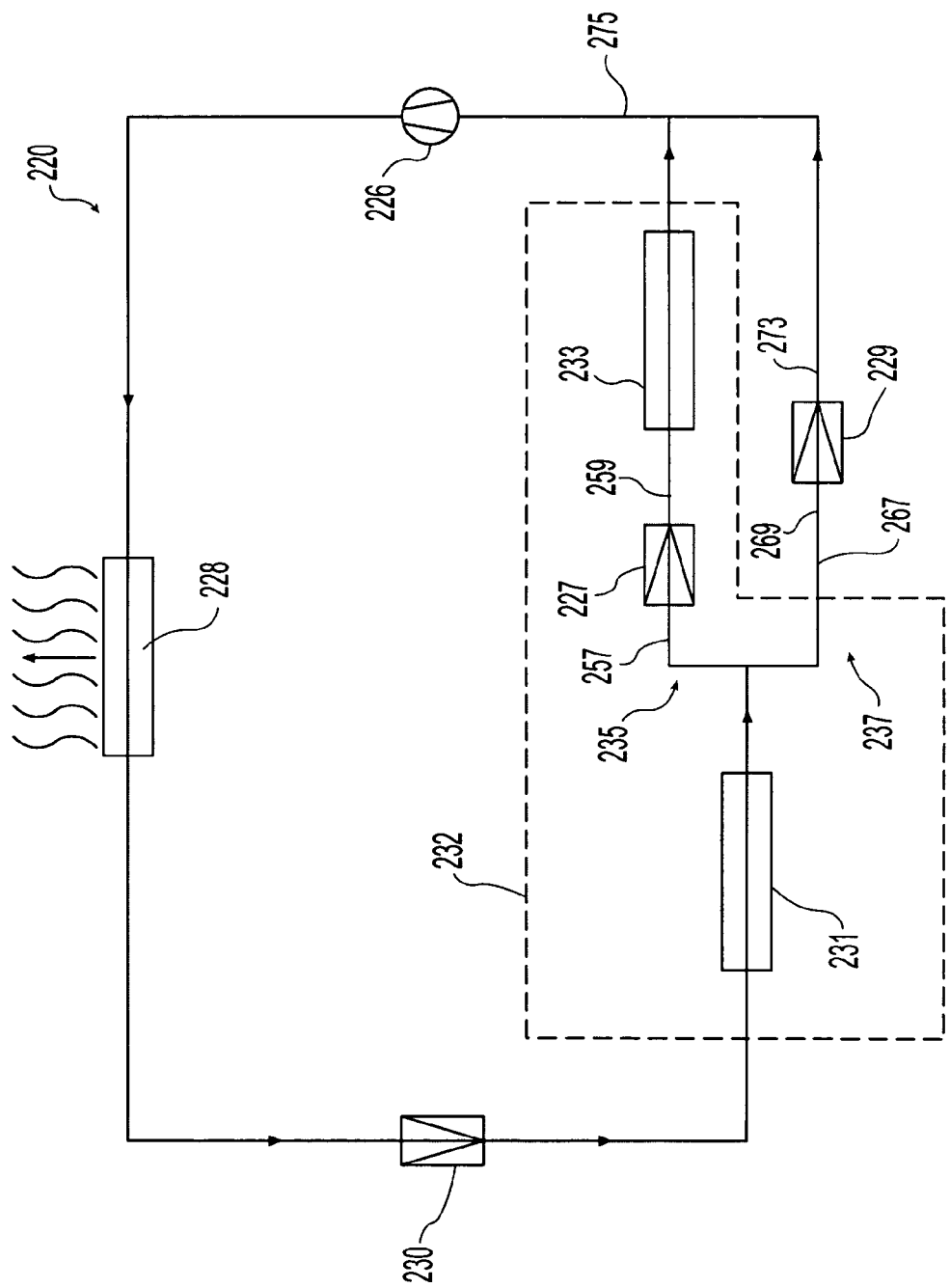
FIG. 8 is a fluid schematic diagram of the refrigeration system of FIG. 7.

FIG. 8 schematically illustrates the CRS 220 of FIG. 7. In operation, the compressor 226 receives suction pressure refrigerant from high-intensity evaporator part 233 and from an expansion device in the form of capillary tube 229 and discharges compressed refrigerant to the condenser 228. Condenser 228 removes thermal energy from the working fluid, while evaporator 232 adds thermal energy to the working fluid. After the high pressure refrigerant is cooled in the condenser 228, high pressure liquid refrigerant flows through an expansion device such as capillary tube 230. After the refrigerant has had its pressure lowered and is expanded in capillary tube 230, refrigerant passes through low-intensity evaporator part 231. The flow of refrigerant is then divided between two parallel branches 235, 237. In branch 235, refrigerant enters high-intensity evaporator part 233 via a capillary tube 227. In branch 237, the refrigerant vapors pass through capillary tube 229 after exiting low-intensity evaporator part 231.

In the schematic diagram of FIG. 8, tubes 227 and 229 are shown as receiving refrigerant from a common output of low-intensity evaporator part 231. However, as discussed in more detail hereinafter with reference to FIG. 12, input end 257 of tube 227 may be disposed on or near a bottom surface of part 231, and input end 269 of tube 229 may receive refrigerant at a higher vertical level within part 231. Thus, tube 227 may typically receive liquid refrigerant in part 231, and tube 229 may typically receive the less dense refrigerant vapor in part 231. That is, tubes 227 and 229 may cooperate to separate the refrigerant in part 231 into a flow of liquid in branch 235 and a flow of vapor in branch 237.

Capillary tube 227 further reduces the refrigerant pressure in branch 235 to a level that is lower than the pressure of the refrigerant that exits capillary tube 230 and that is disposed in low-intensity evaporator part 231. That is, part 231 receives refrigerant from tube 230 at a higher pressure than that of the refrigerant received by part 233 from tube 227. Having had its pressure lowered by capillary tube 227, the refrigerant in high-intensity evaporator part 233 is at a lower temperature than the refrigerant in low-intensity evaporator part 231 during operation. That is, high-intensity evaporator part 233 operates at a lower temperature than does low-intensity evaporator part 231. The reduced pressure refrigerant from capillary tube 230 absorbs thermal energy in evaporator 232 as it is converted from a liquid phase to a gas phase.

In branch 237, the gas refrigerant from low-intensity evaporator part 231 has its pressure lowered by capillary tube 229 to a level that is substantially equal to the pressure of gas refrigerant exiting high-intensity evaporator part 233. Thus, the refrigerant may enter compressor 226 from branches 235, 237 at substantially equal pressures, which may inhibit refrigerant from flowing in a reverse direction through high-intensity evaporator part 233.

Figure 9:
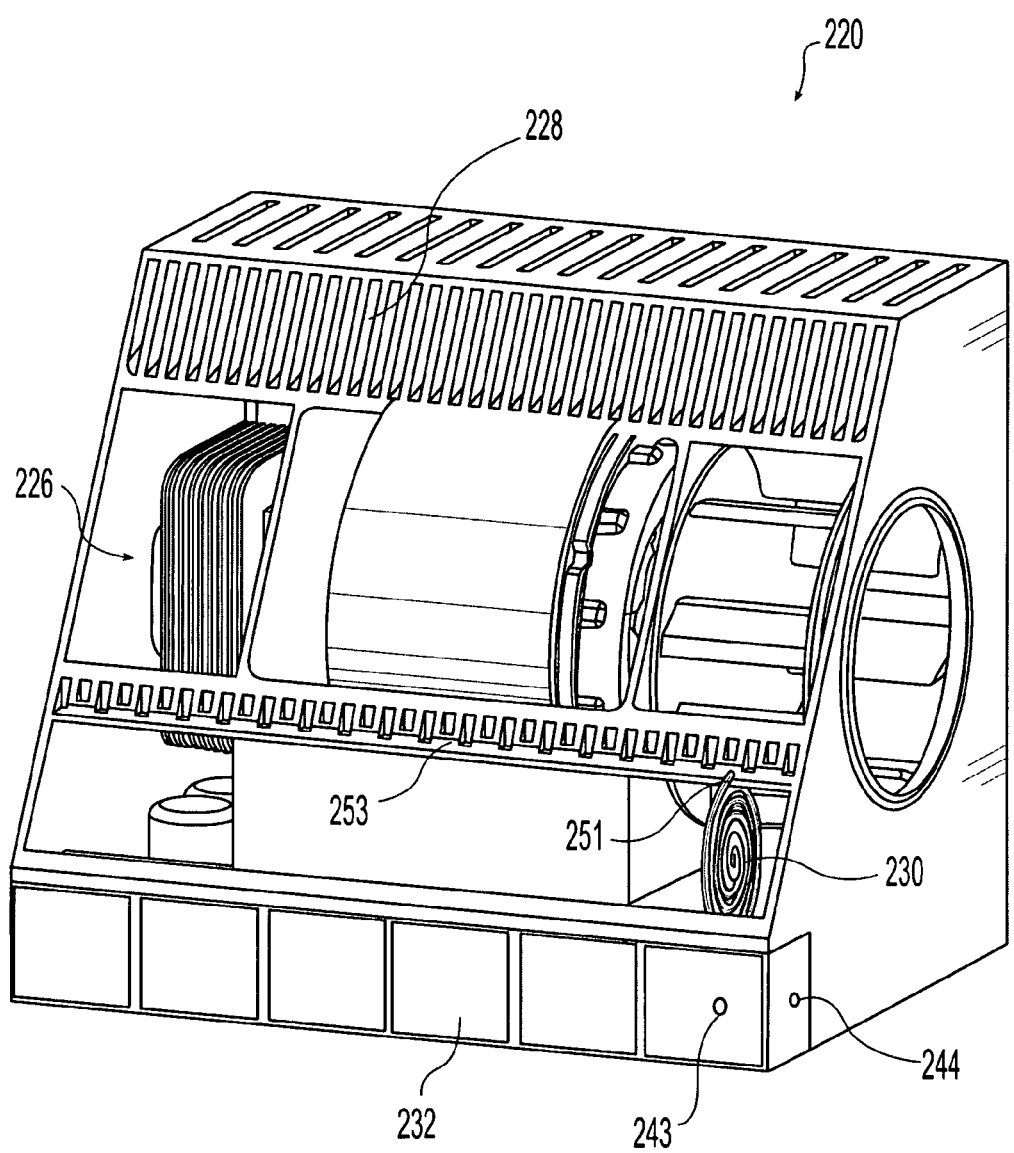
FIG. 9 is a perspective, partially sectional view of the refrigeration system of FIG. 7.
Figure 10:
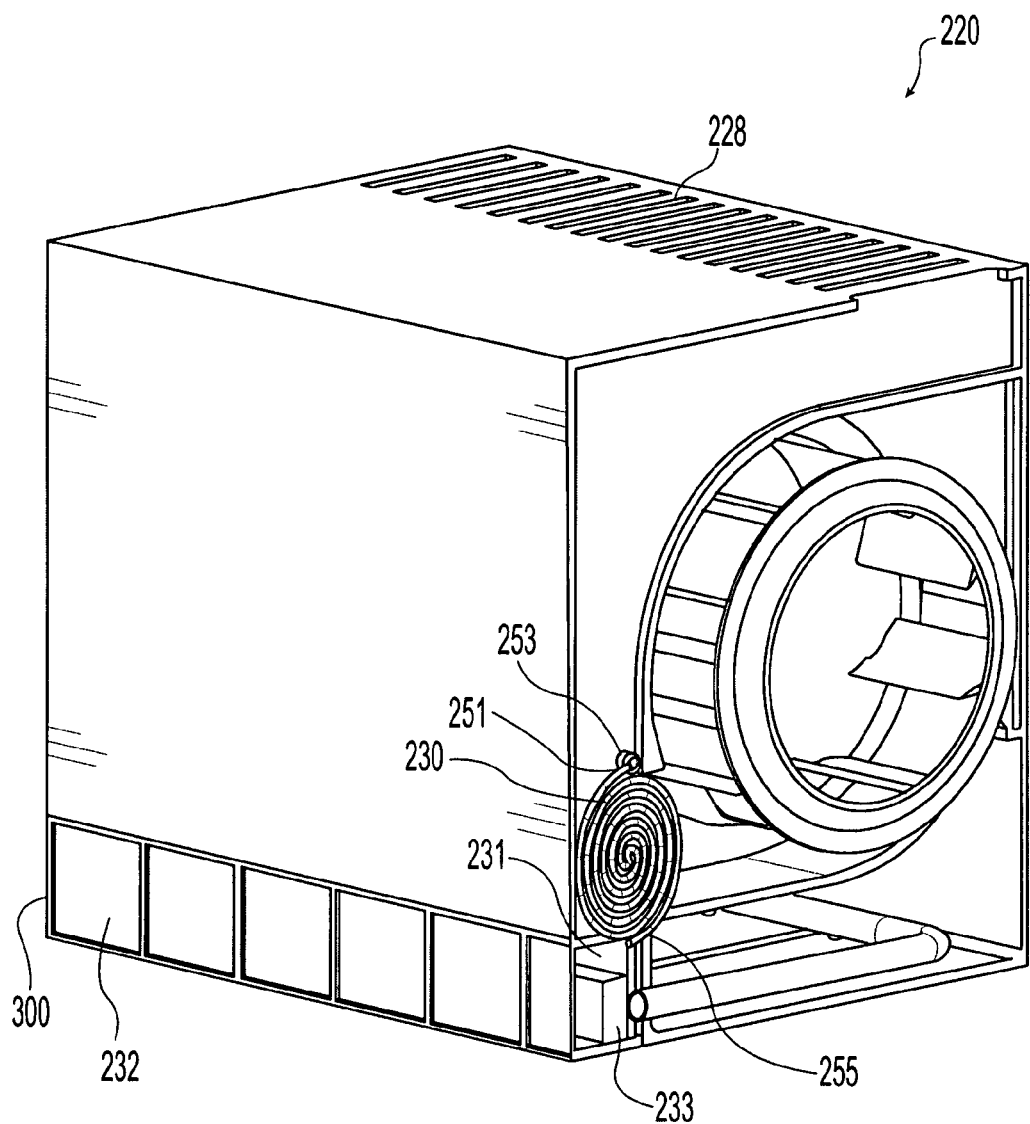
FIG. 10 is another perspective, partially sectional view of the refrigeration system of FIG. 7 with an additional section cut.

FIGS. 9-12 illustrate one possible mechanical configuration of evaporator parts 231, 233 and capillary tubes 227, 229, 230. As best shown in FIGS. 9 and 10, an upper end 251 of capillary tube 230 may receive high pressure liquid refrigerant from a channel 253 of condenser 228. An opposite, lower end 255 of capillary tube 230 may deposit the expanded refrigerant into low-intensity evaporator part 231.

As shown in FIG. 10, high-intensity evaporator part 233 may be in the form of an elongate, hollow conduit having a rectangular cross section. Part 233 may extend as far as end 300 of evaporator 32. Part 233 may be disposed within low-intensity evaporator part 231, which may also be an elongate, hollow conduit having a rectangular cross section. More generally, low-intensity evaporator part 231 may at least partially envelop high-intensity evaporator part 233 such that the lower-temperature part 233 is thermally insulated by higher-temperature part 231 from the still higher temperatures of ambient air and the remainder of CRS 220. Still more generally, low-intensity evaporator part 231 may abut high-intensity evaporator part 233 to thereby thermally insulate the lower-temperature part 233.

The illustrated embodiment includes two isolated evaporator parts 231, 233 wherein the refrigerant in inner part 233 is at a lower pressure than the refrigerant in outer part 231. As a result, the refrigerant in inner part 233 is at a lower temperature than the refrigerant in outer part 231. In the illustrated embodiment, the lower temperature in part 233 is achieved by having all of the refrigerant pass through the outer evaporator part 231 before entering inner evaporator part 233 and by positioning expansion device 227 between the two evaporator parts 231, 233 so that the refrigerant within inner evaporator part 233 is at a lower pressure.

Figure 11:
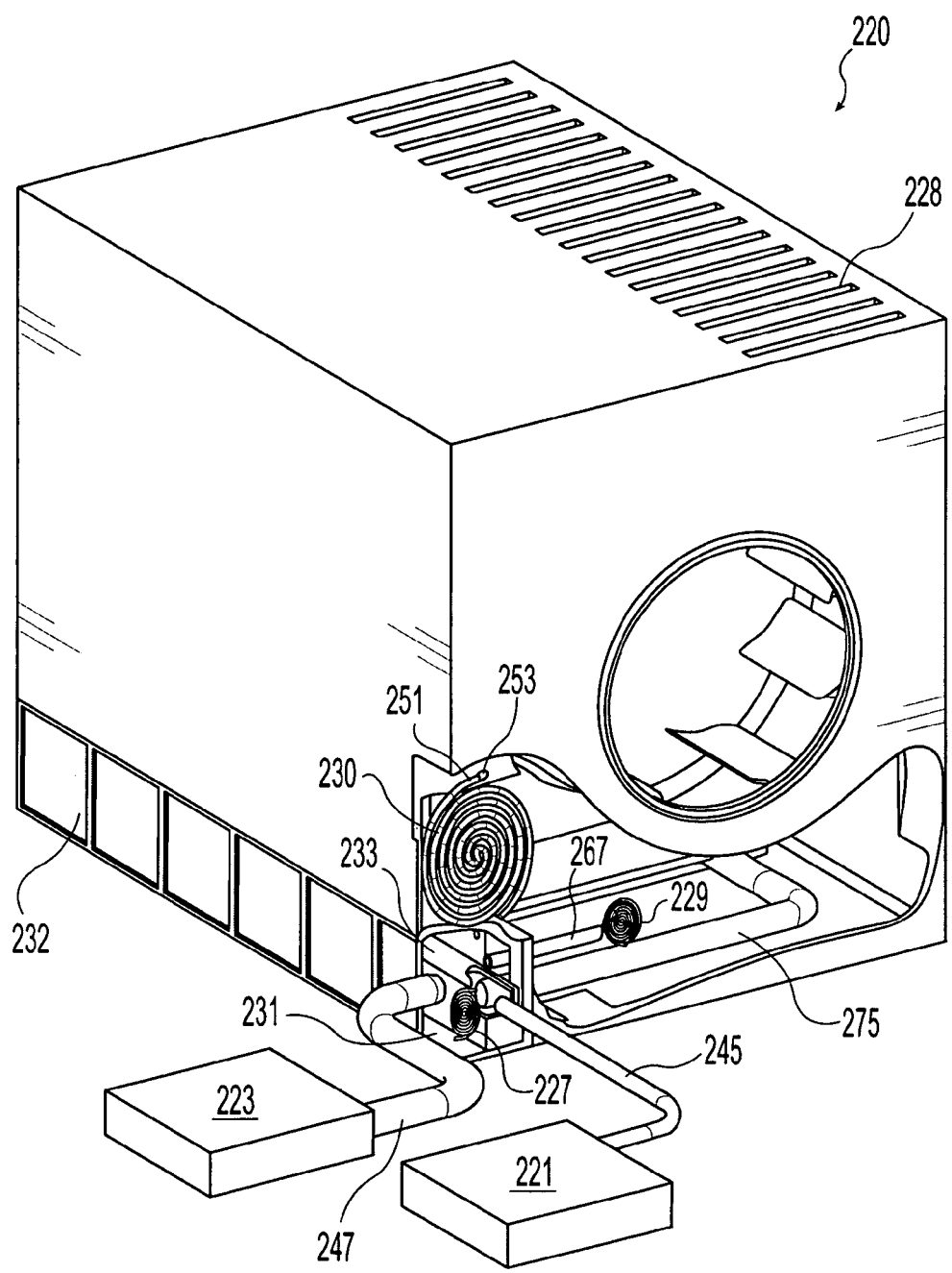
FIG. 11 is a perspective, partially sectional view of the refrigeration system configuration of FIG. 7.
Figure 12:
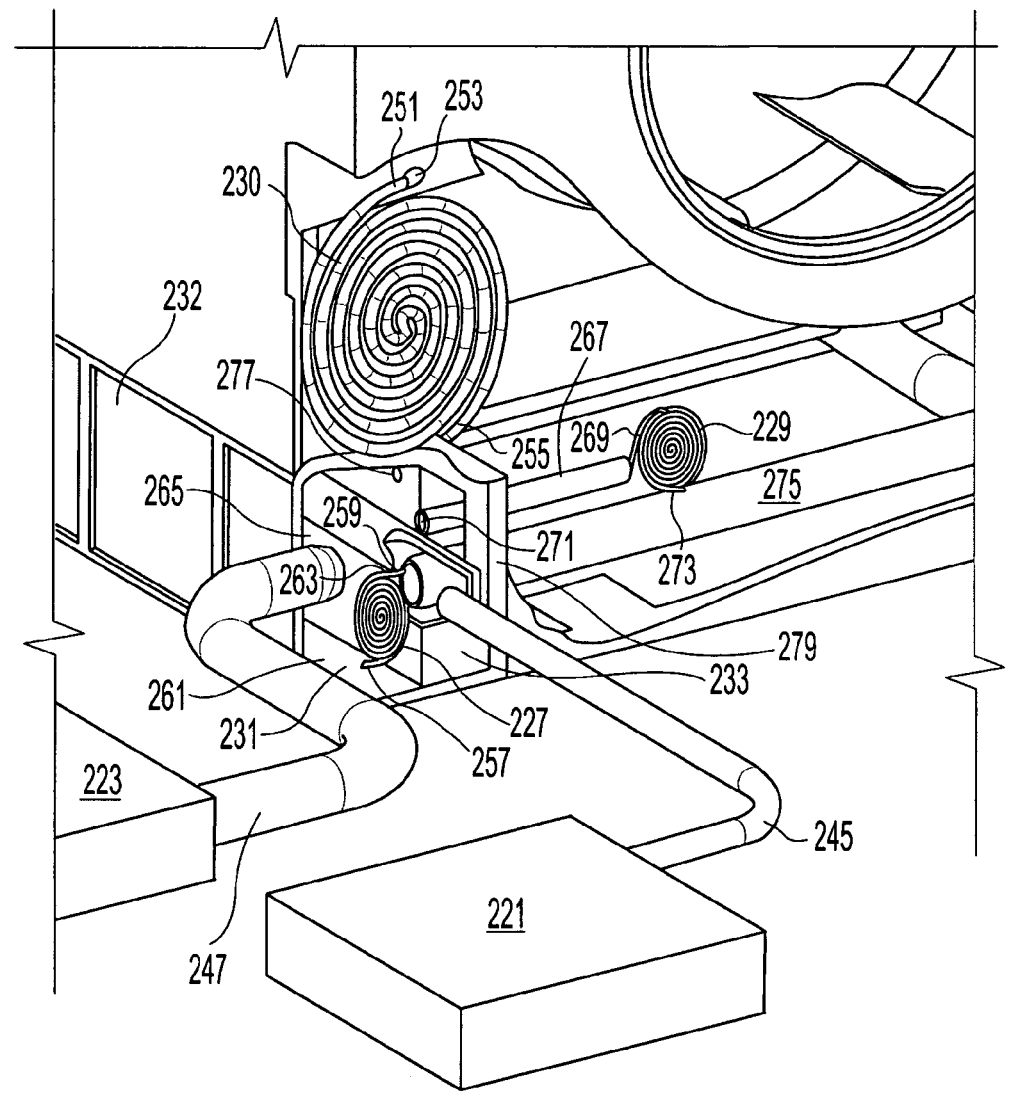
FIG. 12 is an enlarged, fragmentary, partially sectional view of the refrigeration system of FIG. 11.

FIGS. 11 and 12 illustrate one possible arrangement of capillary tubes 227, 229. A lower end 257 of tube 227 is disposed near a bottom surface 261 of low-intensity evaporator part 231. An upper end 259 of tube 227 is in fluid communication with high-intensity evaporator part 233 via a through port 263 in a side Wall 265 of part 233. A conduit 267 fluidly interconnects a first end 269 of the other capillary tube 229 to low-intensity evaporator part 231 via a through port 271 in a side wall 279 of part 231. An opposite end 273 of tube 229 is fluidly connected to a conduit 275 that is also in fluid communication with both high-intensity evaporator part 233 and compressor 226. Tubes 227 and 229 are shown in FIGS. 11 and 12 in simplified spiral forms for ease of illustration. However, it is to be understood that tubes 227 and 229 may have the same coil structure as that shown in FIGS. 10-12 for tube 230.

In operation, capillary tube 230 receives refrigerant from channel 253 of condenser 228. The pressure and temperature of the refrigerant is lowered in tube 230 before the refrigerant is deposited in low-intensity evaporator part 231 via a through port 277 in side wall 279 of part 231. While in evaporator part 231, the refrigerant absorbs thermal energy and cools components 223 via heat pipe 247. A first portion of the refrigerant, which may be primarily gaseous, exits low-intensity evaporator part 231 via conduit 267 and capillary tube 229. The refrigerant pressure and temperature may be further lowered in tube 229. A second portion of the refrigerant, which may be primarily liquid, exits low-intensity evaporator part 231 and enters high-intensity evaporator part 233 via capillary tube 227. Capillary tube 227 may lower the pressure of the refrigerant flowing therethrough such that the refrigerant temperature in part 233 is lower than the refrigerant temperature in part 231. While in evaporator part 233, the refrigerant absorbs thermal energy and cools microprocessor 221 via heat pipe 245. The refrigerant in high-intensity evaporator part 233 is then returned to compressor 226 via conduit 275 at a pressure that may be about equal to the fluid pressure at end 273 of capillary tube 229.

Other features of CRS 220 may be substantially similar to those of CRS 20, and thus are not described in detail herein in order to avoid needless repetition.

Figure 13:
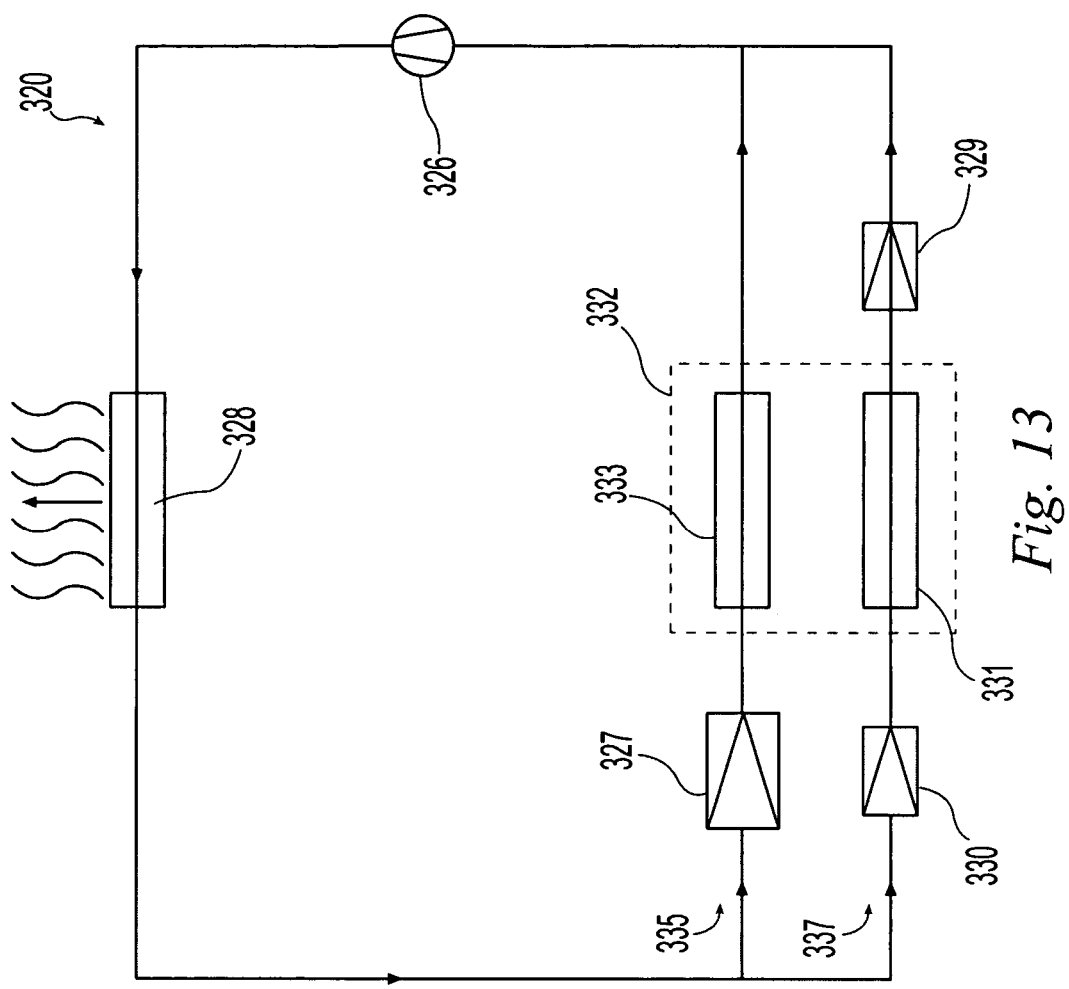
FIG. 13 is a fluid schematic diagram of yet another embodiment of a refrigeration system of the present invention.

In an alternative embodiment of a CRS 320, illustrated in FIG. 13, the refrigerant entering a two-part evaporator 332 from a condenser 328 may be subdivided into two flows or branches 335, 337. In branch 337, the refrigerant has its pressure reduced by a first amount in a capillary tube 330 and enters an outer, low-intensity part 331 of evaporator 332. In branch 335, the refrigerant has its pressure reduced by a second amount in a capillary tube 327 and directly enters an inner, high-intensity part 333 of evaporator 332. Capillary tube 327 is schematically illustrated as being larger than capillary tube 330 in FIG. 13 in order to indicate that tube 327 has more pressure-reducing capacity than does tube 330. This greater pressure-reducing capacity may be due to tube 327 having a greater length than tube 330 and/or tube 327 having a smaller inner diameter than tube 330, for example. Thus, the pressure drop across tube 327 is greater than the pressure drop across tube 330, resulting in the operating temperature within evaporator part 333 being lower than the operating temperature within evaporator part 331. Similarly to analogous evaporator parts 233 and 231 in CRS 220, it may be desirable to use part 333 to cool high temperature components such as microprocessors or field effect transistors, and to use part 331 to cool lower temperature components that may have lower levels of cooling needs.

Low-intensity evaporator part 331 may at least partially envelop and thermally insulate high-intensity evaporator part 333. The pressure of the refrigerant in outer evaporator part 331 may have its pressure further reduced by another expansion device in the form of capillary tube 329 as the refrigerant exits low-intensity evaporator part 331 so that the refrigerant pressure exiting tube 329 is about the same pressure as in high-intensity evaporator part 333. Thus, the refrigerant entering compressor 326 from branches 335, 337 may be at approximately the same pressure. Other methods of providing two evaporator part or regions having different temperatures, however, may also be employed.

As described above, by positioning the outer, medium temperature, evaporator region so that it substantially encloses the inner, low temperature, evaporator region, the outer evaporator region helps to insulate and thermally isolate the low temperature inner evaporator region from the surrounding environment and reduce thermal losses from the inner evaporator to the environment. Other configurations of the two evaporator regions, however, may also be employed with the present invention. Furthermore, by positioning the low temperature evaporator region within the medium temperature evaporator region, if the thermal load on the low temperature evaporator becomes excessive and raises the temperature of the inner region to that of the outer evaporator region, the cooling capacity of the outer evaporator region will then be employed together with the capacity of the inner evaporator region to meet the load placed on the inner evaporator region. As described in greater detail below, a heat pipe or other device for conducting thermal energy may be placed in thermal communication with the inner low temperature evaporator region by inserting one end of the device in a port on the CRS and placing the other end of the device in thermal communication with a high intensity cooling location. Heat spreaders may be coupled to the outer surfaces of the medium temperature evaporator region to provide thermal communication between the medium temperature evaporator and the low intensity cooling locations. For example, a finned heat exchanger could be coupled to the evaporator to cool the air within a computer housing and thereby cool electronic equipment contained within the housing. Alternatively, thermally conductive devices could be directly coupled to both the medium temperature evaporator and low intensity cooling locations.

The refrigeration system of the present invention has been described herein as including a compressor. However, it is also possible for the refrigeration system to include another type of fluid pumping device, such as a conventional pump. If the refrigeration system includes a conventional pump, the refrigeration system may include a type of flow regulator other than a capillary tube or an expansion device.

The refrigeration system has also been described as including a converter that is operably coupled to an AC power supply and that supplies DC power to a refrigeration system component. However, it is also possible for the converter to be operably coupled to a DC power supply, and/or to supply AC power to a refrigeration system component. Thus, the converter may use whatever power supply is available as input and, while providing DC power to the electronic equipment cooled by the refrigeration system, also provide AC or DC power to the refrigeration system component.

While this invention has been described as having an exemplary design, the present invention may be further modified within the spirit and scope of this disclosure. This application is therefore intended to cover any variations, uses, or adaptations of the invention using its general principles.

What is claimed is:

1. A refrigeration system for use in cooling electronic equipment, said system comprising a closed vapor compression circuit having operably disposed therein a compressor, a condenser, a first expansion device, a second expansion device, and a two-part evaporator, wherein a first part of said evaporator receives working fluid from said first expansion device at a first pressure, and a second part of said evaporator receives working fluid from said second expansion device at a second pressure that is different than the first pressure, wherein said second expansion device receives working fluid from said first expansion device, and the second pressure is less than the first pressure.

2. A refrigeration system for use in cooling electronic equipment, said system comprising a closed vapor compression circuit having operably disposed therein a compressor, a condenser, a first expansion device, a second expansion device, and a two-part evaporator, wherein a first part of said evaporator receives working fluid from said first expansion device at a first pressure, and a second part of said evaporator receives working fluid from said second expansion device at a second pressure that is different than the first pressure, wherein a working fluid temperature in said first part of said evaporator is higher than a working fluid temperature in said second part of said evaporator during operation.

3. A refrigeration system for use in cooling electronic equipment, said system comprising a closed vapor compression circuit having operably disposed therein a compressor, a condenser, a first expansion device, a second expansion device, and a two-part evaporator, wherein a first part of said evaporator receives working fluid from said first expansion device at a first pressure, and a second part of said evaporator receives working fluid from said second expansion device at a second pressure that is different than the first pressure, wherein said first part of said evaporator at least partially envelops said second part of said evaporator.

4. The refrigeration system of claim 3 wherein said first part of said evaporator comprises a means for thermally insulating said second part of said evaporator.

5. A refrigeration system for use in cooling electronic equipment, said system comprising a closed vapor compression circuit having operably disposed therein a compressor, a condenser, a first expansion device, a second expansion device, and a two-part evaporator, wherein a first part of said evaporator receives working fluid from said first expansion device at a first pressure, and a second part of said evaporator receives working fluid from said second expansion device at a second pressure that is different than the first pressure, and further comprising a third expansion device configured to receive working fluid from said first part of said evaporator.

6. The refrigeration system of claim 5 wherein said third expansion device is configured to provide working fluid to said compressor at a pressure that is substantially equal to a pressure at which said second part of said evaporator provides working fluid to said compressor.

7. A compact refrigeration system comprising a closed vapor compression circuit having operably disposed therein a compressor, a condenser, at least one expansion device and a two-part evaporator, a first part of said evaporator at least partially enveloping a second part of said evaporator, said circuit being configured such that a working fluid temperature in said first part of said evaporator is higher than a working fluid temperature in said second part of said evaporator during operation.

8. The system of claim 7 wherein said at least one expansion device comprises a first expansion device and a second expansion device, said circuit being configured such that said first part of said evaporator receives working fluid from said first expansion device, and said second part of said evaporator receives working fluid from said second expansion device.

9. The system of claim 8 wherein said circuit is configured such that said first part of said evaporator receives working fluid from said first expansion device at a first pressure, and said second part of said evaporator receives working fluid from said second expansion device at a second pressure that is different than the first pressure.

10. The system of claim 9 wherein said second expansion device receives working fluid from said first expansion device, and the second pressure is less than the first pressure.

11. The system of claim 7 wherein said first part of said evaporator comprises a means for thermally insulating said second part of said evaporator.

12. The system of claim 7 wherein said first part of said evaporator abuts said second part of said evaporator.

13. A method of operating a refrigeration system comprising:
providing a closed vapor compression circuit having operably disposed therein a compressor, a condenser, a first expansion device, a second expansion device, and a two-part evaporator;
receiving working fluid in a first part of said evaporator from said first expansion device at a first pressure; and
receiving working fluid in a second part of said evaporator from said second expansion device at a second-pressure that is different from said first pressure, and
comprising a further step of receiving working fluid in said second expansion device from said first expansion device, the second pressure being less than the first pressure.

14. A method of operating a refrigeration system comprising:
providing a closed vapor compression circuit having operably disposed therein a compressor, a condenser, a first expansion device, a second expansion device, and a two-part evaporator;
receiving working fluid in a first part of said evaporator from said first expansion device at a first pressure; and
receiving working fluid in a second part of said evaporator from said second expansion device at a second pressure that is different from said first pressure,
wherein a working fluid temperature in said first part of said evaporator is higher than a working fluid temperature in said second part of said evaporator during operation.

15. A method of operating a refrigeration system comprising:
providing a closed vapor compression circuit having operably disposed therein a compressor, a condenser, a first expansion device, a second expansion device, and a two-part evaporator;
receiving working fluid in a first part of said evaporator from said first expansion device at a first pressure; and
receiving working fluid in a second part of said evaporator from said second expansion device at a second pressure that is different from said first pressure, and
comprising a further step of using said first part of said claim evaporator to at least partially envelop said second part of said evaporator.

16. The method of claim 15 wherein said using step includes using said first part of said evaporator to thermally insulate said second part of said evaporator.

17. A method of operating a refrigeration system comprising:
providing a closed vapor compression circuit having operably disposed therein a compressor, a condenser, a first expansion device, a second expansion device, and a two-part evaporator;
receiving working fluid in a first part of said evaporator from said first expansion device at a first pressure; and
receiving working fluid in a second part of said evaporator from said second expansion device at a second pressure that is different from said first pressure, and comprising a further step of receiving working fluid in a third expansion device from said first part of said evaporator.

18. The method of claim 17 comprising a further step of using said third expansion device to provide working fluid to said compressor at a pressure that is substantially equal to a pressure at which said second part of said evaporator provides working fluid to said compressor.

19. The method of claim 17, comprising a further step of using said second expansion device and said third expansion device to separate the working fluid into liquid working fluid and vapor working fluid.

* * * * *